USO10110371B2

United States Patent
Nakama (10) Patent No.: US 10,110,371 B2
(45) Date of Patent: Oct. 23, 2018

(54) PHASE DIFFERENCE ESTIMATION DEVICE AND COMMUNICATION DEVICE HAVING THE PHASE DIFFERENCE ESTIMATION DEVICE

(71) Applicant: FANUC CORPORATION, Yamanashi (JP)

(72) Inventor: Tomomasa Nakama, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/785,594

(22) Filed: Oct. 17, 2017

(65) Prior Publication Data

US 2018/0115411 A1 Apr. 26, 2018

(30) Foreign Application Priority Data

Oct. 20, 2016 (JP) .................................. 2016-205744

(51) Int. Cl.
| | |
|---|---|
| *H04L 7/04* | (2006.01) |
| *H04L 7/033* | (2006.01) |
| *H04L 7/00* | (2006.01) |
| *H03L 7/08* | (2006.01) |
| *H03L 7/081* | (2006.01) |

(52) U.S. Cl.
CPC ............ *H04L 7/042* (2013.01); *H03L 7/0807* (2013.01); *H03L 7/0814* (2013.01); *H04L 7/0045* (2013.01); *H04L 7/0331* (2013.01)

(58) Field of Classification Search
CPC ....... H03L 7/085; H03L 7/087; H04L 7/0331; H04L 7/033; H04L 7/0087; H04W 56/001
See application file for complete search history.

(56) References Cited

U.S. PATENT DOCUMENTS

2015/0304971 A1* 10/2015 Shor ................... H04W 56/001
    370/350
2016/0373244 A1* 12/2016 Lin ....................... H03L 7/0807

FOREIGN PATENT DOCUMENTS

| JP | 9-8787 | 1/1997 |
|---|---|---|
| JP | 2002-196087 | 7/2002 |
| JP | 2004-172653 | 6/2004 |
| JP | 2014-171014 | 9/2014 |
| JP | 2016-119548 | 6/2016 |

* cited by examiner

*Primary Examiner* — David S Huang
(74) *Attorney, Agent, or Firm* — Wenderoth, Lind & Ponack, L.L.P.

(57) ABSTRACT

A device includes a recovery unit that separates recovery data and a recovery clock from input data, a first detection unit that detects a timing at which a phase difference between a generated processing clock and the recovery clock is zero, a second detection unit that detects a synchronization code included in the recovery data using the recovery clock, and a calculation unit that calculates a phase difference between the synchronization code and the processing clock using a ratio between a first number of clock generation times of the processing clock in a period from a first timing at which the detected phase difference is zero to a second timing at which the phase difference is subsequently zero, and a second number of clock generation times of the processing clock in a period from the first timing to a third timing in which the synchronization code is detected.

6 Claims, 11 Drawing Sheets

CASE WHERE NUMBER OF RISING EDGES IS ZERO

RECOVERY CLOCK Rclk

PROCESSING CLOCK Sclk

PHASE DIFFERENCE ESTIMATION DEVICE AND COMMUNICATION DEVICE HAVING THE PHASE DIFFERENCE ESTIMATION DEVICE

This application is based on and claims the benefit of priority from Japanese Patent Application No. 2016-205744, filed on 20 Oct. 2016, the content of which is incorporated

BACKGROUND OF THE INVENTION

Field of the Invention

The present invention relates to a phase difference estimation device that obtains a phase difference between a synchronization code included in input communication data and a processing clock and a communication device having the phase difference estimation device.

Related Art

In the past, a method of synchronizing a master device and a slave device has been proposed. However, there is a phase difference between communication data that a slave device receives from a master device and a processing clock of the slave device, and this phase difference is a synchronization error between the master device and the slave device. As a technique for cancelling the synchronization error between the master device and the slave device due to the phase difference, a system that performs time synchronization between communication devices, for example, is disclosed in Patent Document 1. Specifically, this system transmits communication data for time synchronization from a master device to a slave device via a communication line. The slave device measures a phase difference between the phase of communication data and the phase of a clock signal of a destination clock domain by clock data recovery (CDR) when the communication data for time synchronization passes through a clock domain boundary in the slave device. By doing so, the slave device can correct the time of the slave device using the measured phase difference.

As a technique related to the present invention, a time measurement circuit is disclosed in Patent Document 2. Specifically, two oscillators 10 and 20 generate clock signals CLK1 and CLK2 having a cycle difference ΔT and a transmission pulse SP is output according to the clock signal CLK1. A reflection wave corresponding to the transmission pulse SP is received, and a reception pulse RP is output. A phase comparator 30 compares the phases of the clock signals CLK1 and CLK2 and outputs an in-phase signal P1, and a phase comparator 40 compares the phases of the reception pulse RP and the clock signal CLK2 and outputs an in-phase signal P2. A counter circuit 50 counts the clock signal CLK1 in a period where the in-phase signal P2 is output after the in-phase signal PI is output and measures a time difference τ between the transmission pulse SP and the reception pulse RP on the basis of a cycle difference ΔT between the count value N and the clock signals CLK1 and CLK2.

Patent Document 1: Japanese Unexamined Patent Application, Publication No. 2016-119548

Patent Document 2: Japanese Unexamined Patent Application, Publication No. 2002-196087

SUMMARY OF THE INVENTION

However, Patent Document 1 discloses that phase difference information is obtained from CDR (clock data recovery) (see CDR 27 in FIG. 8 of Patent Document 1, for example). When an application specific integrated circuit (ASIC) for communication and synchronization of a unit is created, CDR is prepared as an IP core of an ASIC vender, and whether phase difference information is obtained or not depends on the CDR. Moreover, even when phase difference information is obtained from certain CDR, the CDR may become a bottleneck, it cannot be said that the same ASIC is created by separate technologies or separate ASIC venders, and portability is low. Although a method of obtaining phase difference information using an analog circuit such as a delayed-locked loop (DLL) may be considered as another means, portability is low.

In Patent Document 2, the phase difference between the reception pulse and the clock signal CLK1 is obtained using a digital circuit only. However, since the reception pulse is received every clock, although it is possible to obtain the phase difference, this technique cannot be applied to the synchronization communication data which does not appear every clock.

Therefore, an object of the present invention is to provide a communication device having a phase difference estimation device capable of calculating a phase difference between synchronization data of reception data and a processing clock using a digital circuit.

A phase difference estimation device according to a first aspect of the present invention includes: a recovery unit that separates recovery data and a recovery clock from input communication data and outputs the recovery data and the recovery clock; a phase difference zero detection unit that detects a timing at which a phase difference between a generated processing clock and the recovery clock is zero; a synchronization code detection unit that detects a synchronization code included in the recovery data using the recovery clock; and a phase difference calculation unit that calculates a phase difference between the synchronization code and the processing clock using a ratio between a first number of clock generation times of the processing clock in a period from a first timing at which the phase difference detected by the phase difference zero detection unit is zero to a second timing at which the phase difference is subsequently zero, and a second number of clock generation times of the processing clock in a period from the first timing to a third timing in which the synchronization code is detected by the synchronization code detection unit.

According to a second aspect of the present invention, in the phase difference estimation device as described in the first aspect, it is preferable that the phase difference estimation device includes: a counter that counts the number of rising or falling edges of the processing clock from the first timing; a first latch circuit that outputs a count value of the counter from the first timing to the third timing on the basis of a synchronization code detection signal from the synchronization code detection unit; and a second latch circuit that outputs a count value of the counter from the first timing to the second timing, wherein the second number of clock generation times corresponds to the count value output from the first latch circuit and the first number of clock generation times corresponds to the count value output from the second latch circuit.

According to a third aspect of the present invention, in the phase difference estimation device as described in the second aspect, it is preferable that the phase difference calculation unit calculates the phase difference between the synchronization code and the processing clock by dividing an output value of the first latch circuit by an output value of the second latch circuit when the frequency of the processing clock is higher than the frequency of the recovery clock.

According to a fourth aspect of the present invention, in the phase difference estimation device as described in the second aspect, it is preferable that the phase difference calculation unit calculates the phase difference between the synchronization code and the processing clock by subtracting a value obtained by dividing an output value of the first latch circuit by an output value of the second latch circuit from 1 when the frequency of the processing clock is lower than the frequency of the recovery clock.

According to a fifth aspect of the present invention, in the phase difference estimation device according to any one of the second to fourth aspects, it is preferable that a filter that takes an average value of intervals between timings at which the phase difference is zero is provided between the second latch circuit and the phase difference calculation unit.

A communication device according to a sixth aspect of the present invention includes: the phase difference estimation device according to any one of the first to fifth; a first oscillator that generates the processing clock; and a second oscillator that generates a clock having a frequency shifted by a certain amount from the frequency of the first oscillator, wherein the communication device processes transmission communication data using the clock of the second oscillator.

According to the present invention, it is possible to calculate a phase difference between synchronization data of reception data and a processing clock using a digital circuit.

DETAILED DESCRIPTION OF THE INVENTION

Figure 1:
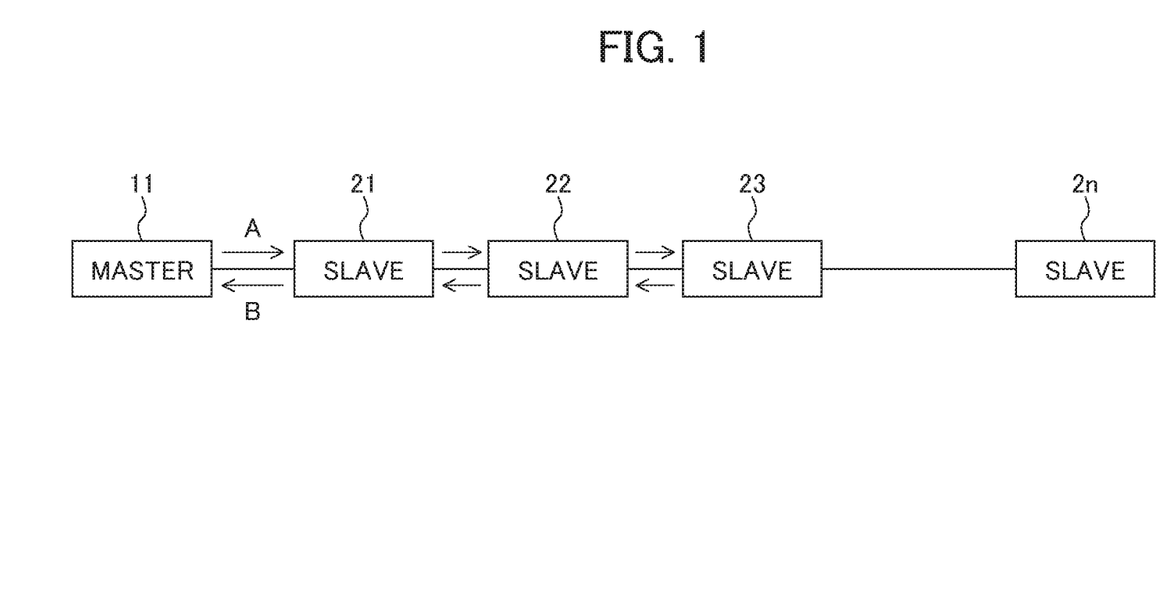
FIG. 1 is a block diagram illustrating a communication system including a master and a plurality of slaves.

Hereinafter, embodiments of the present invention will be described with reference to the drawings. First, a configuration of a communication system including a master and a plurality of slaves as communication devices will be described. FIG. 1 is a block diagram illustrating a communication system including a master and a plurality of slaves. A communication system illustrated in FIG. 1 includes a master 11 and n slaves 21 to 2$n$ (n is a positive integer). In FIG. 1, the number of slaves is 4 or more (n>3).

The master 11 transmits a communication delay measurement signal A to a neighboring slave 21. Upon receiving the signal A, the slave 21 transmits a signal B to the master 11. The master 11 calculates a value obtained by subtracting a period elapsed until the signal B is transmitted after the slave 21 receives the signal A from a period elapsed until the signal B is received after the signal A is transmitted. The master 11 uses a value obtained by dividing the calculated value by 2 as a communication delay td between the master 11 and the slave 21. The master 11 transmits the communication delay td and data indicating the transmission time point T1 to the slave 21, and the slave 21 uses a value obtained by adding the communication delay td to the received time point T1 of the master 11 as a current time point T2 (=T1+td). In this way, synchronization between the master 11 and the slave 21 is realized.

Figure 2:
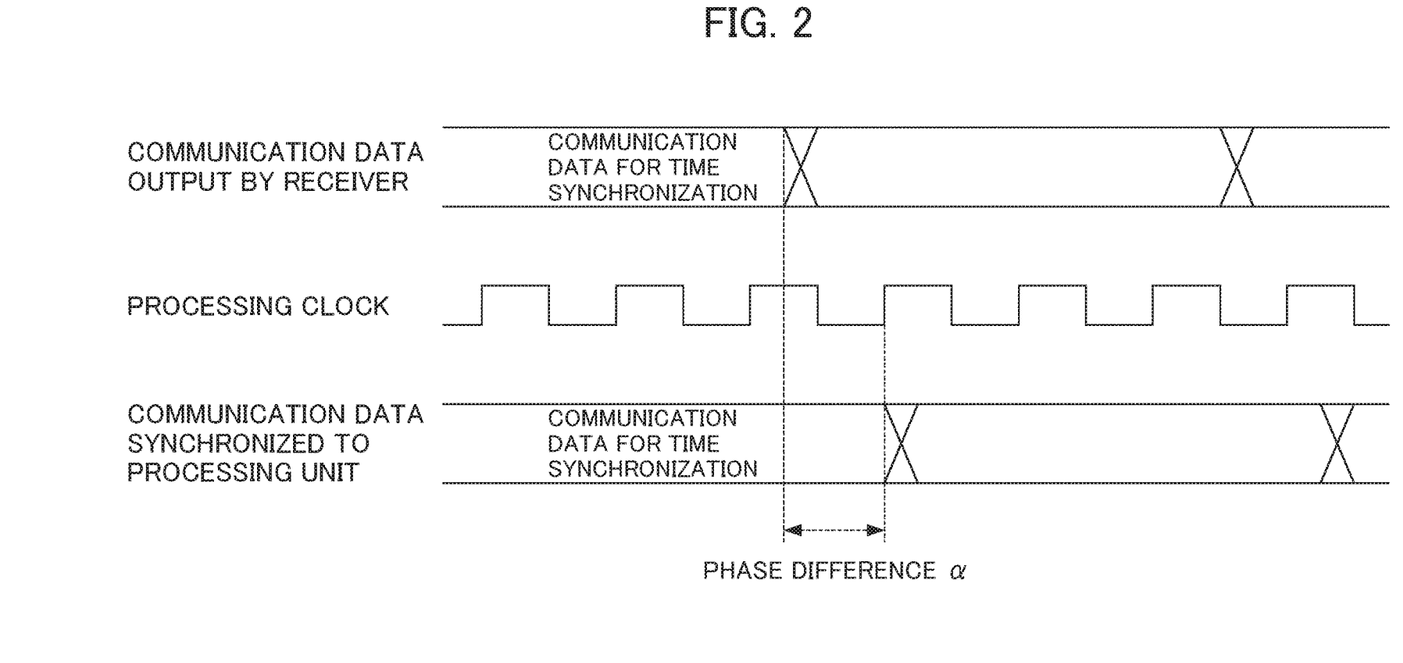
FIG. 2 is a diagram illustrating a phase difference between communication data received from a master and communication data synchronized with the clocks at which a processing unit of a slave performs processing.

Synchronization between the slaves 21 and 22 is performed similarly to the synchronization between the master 11 and the slave 21. In this case, the slave 21 operates similarly to the master 11. The synchronization between the slaves 23 to 2$n$ is also performed similarly to the synchronization between the master 11 and the slave 21. However, as illustrated in FIG. 2, there is a phase difference α between the communication data that a receiver of the slave 21 receives from the master 11 and the communication data processed at the processing clock, and the phase difference α is a synchronization error between the master 11 and the slave 21. The phase difference α is at most one processing clock. Similarly, when the slaves 21 to 2$n$ are synchronized, a synchronization error between the master 11 and the slave 2$n$ is at most n×(one processing clock), Therefore, a circuit that estimates a phase difference is necessary to cancel this synchronization error.

Hereinafter, a phase difference estimation device that calculates a phase difference between the clock of reception data and the processing clock of a slave using a digital circuit will be described.

First Embodiment

Figure 3:
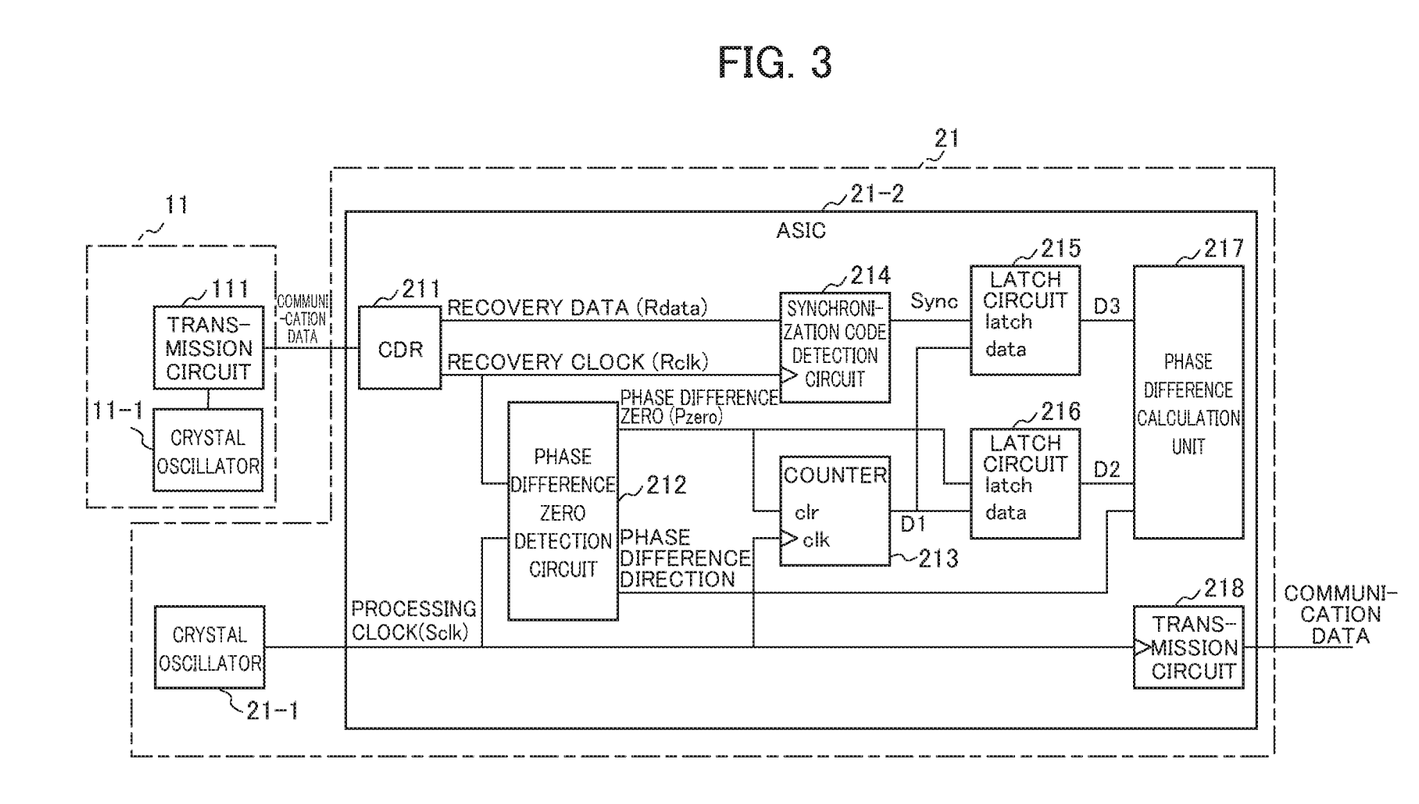
FIG. 3 is a block diagram illustrating a configuration of a phase difference estimation circuit that serves as a phase difference estimation device of a first embodiment of the present invention.
Figure 4:
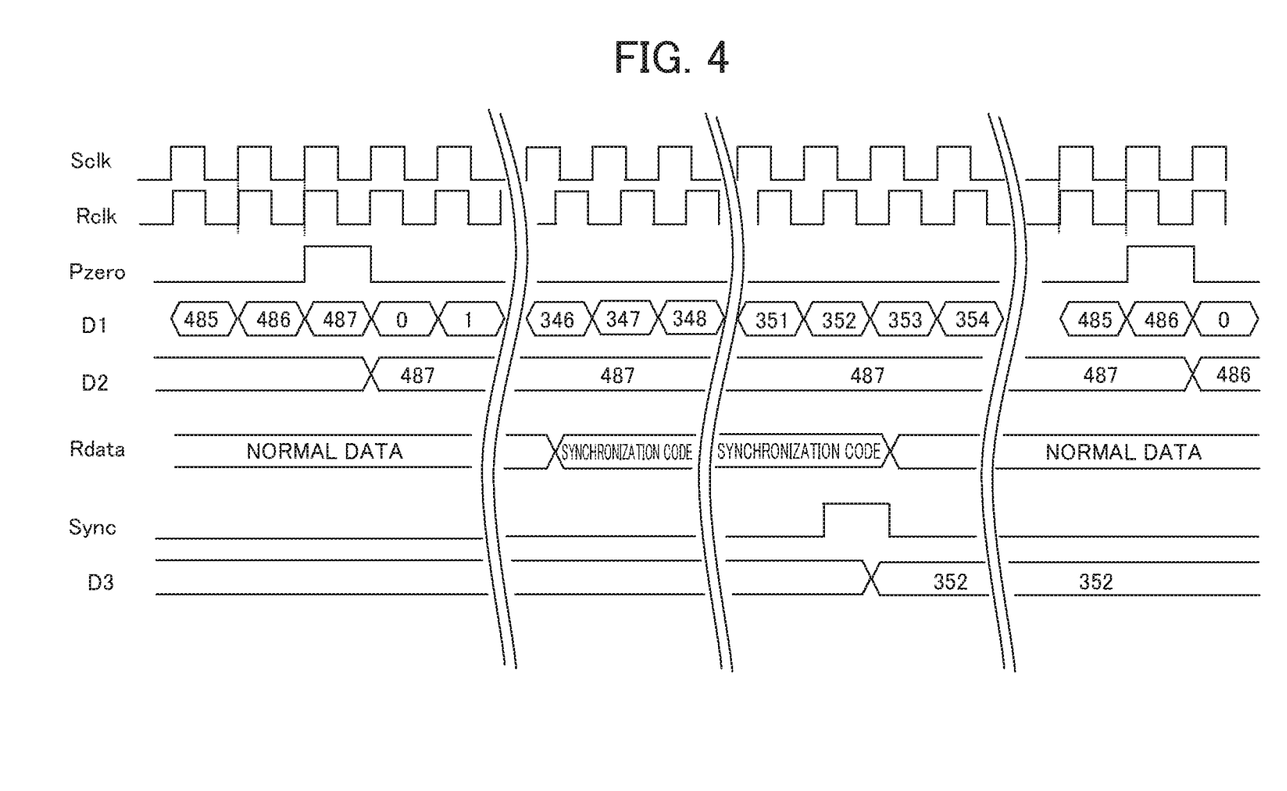
FIG. 4 is a timing chart illustrating an operation of the phase difference estimation circuit.

FIG. 3 is a block diagram illustrating a configuration of a phase difference estimation circuit that serves as a phase difference estimation device of a first embodiment of the present invention. FIG. 4 is a timing chart illustrating an operation of the phase difference estimation circuit. FIG. 3 illustrates the configuration of the master 11 and the slave 21 illustrated in FIG. 1. The slave 21 includes a phase difference estimation circuit 21-2 and a crystal oscillator 21-1. The phase difference estimation circuit 21-2 is an application specific integrated circuit (ASIC). The master 11 includes a crystal oscillator 11-1 and a transmission circuit 111. As illustrated in FIG. 3, the phase difference estimation circuit 21-2 of the present embodiment includes a clock data recovery (CDR) 211 that serves as a recovery unit, a phase difference zero detection circuit 212 that serves as a phase difference zero detection unit, a counter 213, a synchronization code detection circuit 214 that serves as a synchronization code detection unit, two latch circuits 215 and 216, and a phase difference calculation unit 217. Moreover, the phase difference estimation circuit 21-2 includes a transmission circuit 218 that transmits communication data to the slave 22 using a processing clock Sclk generated by the crystal oscillator 21-1.

The CDR 211 is a circuit that outputs recovery data Rdata illustrated in FIG. 4 and a recovery clock Rclk to use the recovery data Rdata from the communication data transmitted from the master 11 so that the communication data can be used by the phase difference estimation circuit 21-2 which is an ASIC. The CDR 211 is prepared as an IP core of an ASIC vendor. The recovery clock and the recovery data are basic elements of CDR, and any CDR outputs a recovery clock and recovery data.

The phase difference zero detection circuit 212 outputs a pulse Pzero as a phase difference zero signal to the counter 213 and the latch circuit 216 when the phase difference between the recovery clock Rclk output from the CDR 211 and the processing clock Sclk output from the crystal oscillator 21-1 is zero. A signal indicating which one of the two clocks Rclk and Sclk is earlier is output to the phase difference calculation unit 217 as a phase difference direction signal. Specific processing content of the phase difference zero detection circuit 212 will be described later.

As illustrated in FIG. 4, the synchronization code detection circuit 214 outputs a pulse Sync to a latch terminal (latch terminal) of the latch circuit 215 when a synchronization code in the recovery data Rdata is detected. The synchronization code is inserted between items of normal data in the recovery data Rdata.

When the pulse Pzero is input to a clear terminal (clr terminal), the counter 213 puts its output D1 to "0" and adds "+1" to the output D1 every signal rising edge of a clock terminal (elk terminal). The output D1 is output to the data terminals (data terminal) of the latch circuits 215 and 216. The counter 213 counts the number of signal rising edges of the processing clock Sclk from the timing at which the phase difference is zero. The counter 213 may count the number of signal falling edges of the processing clock Sclk.

The latch circuits 215 and 216 hold the count value of the output D1 input to the data terminal (data terminal) and outputs the outputs D3 and D2 to the phase difference calculation unit 217 when the signal level input to the latch terminal (latch terminal) is "1".

The phase difference calculation unit 217 is a circuit that calculates the phase difference between the processing clock Sclk and the synchronization code. Specific processing content of the phase difference calculation unit 217 will be described later.

Figure 5:
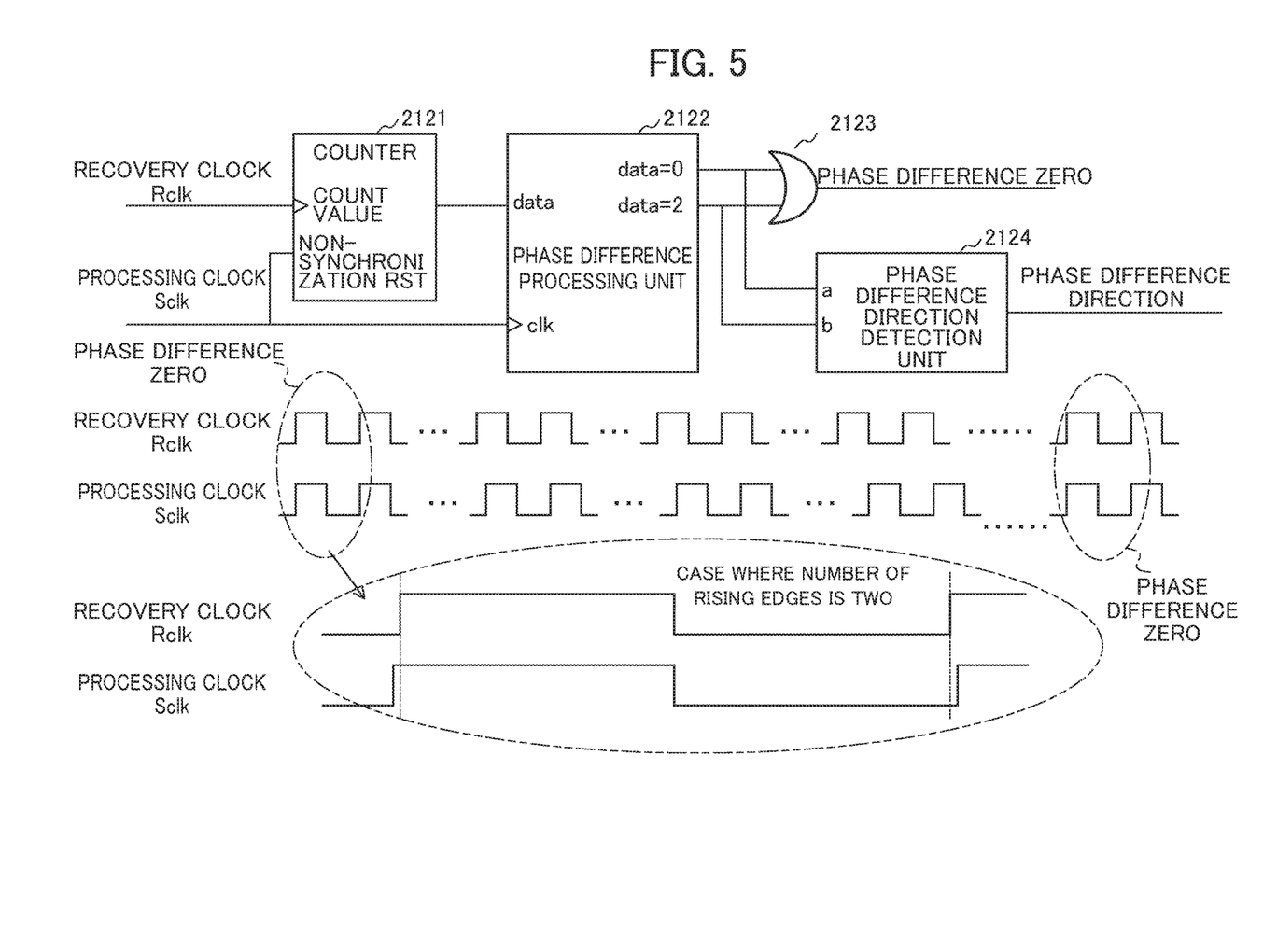
FIG. 5 is a block diagram illustrating a configuration of a phase difference zero detection circuit and is a timing chart when the processing clock Sclk has a lower frequency than a recovery clock Rclk.
Figure 6:
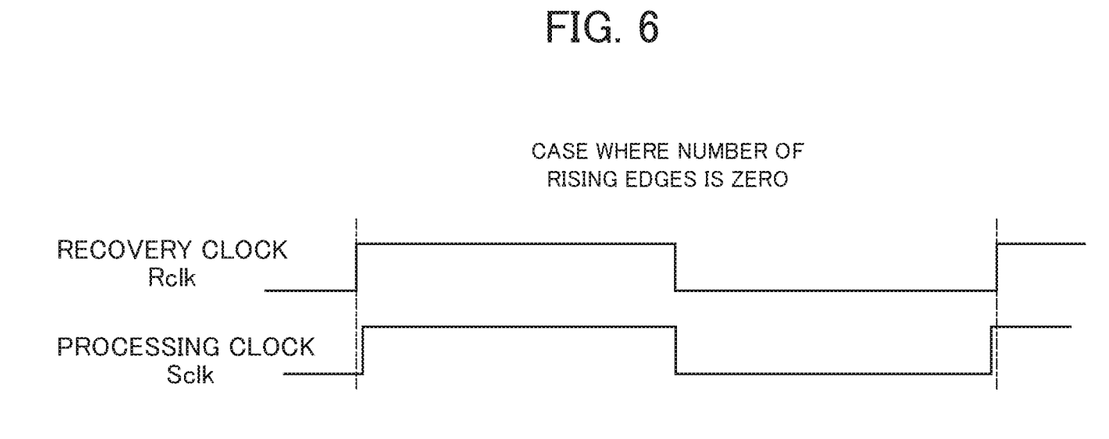
FIG. 6 is a timing chart when the processing clock Sclk has a higher frequency than the recovery clock Rclk.

FIG. 5 illustrates a block diagram illustrating a configuration of the phase difference zero detection circuit and illustrates a timing chart when the processing clock Sclk has a lower frequency than the recovery clock Rclk. FIG. 6 illustrates a timing chart when the processing clock Sclk has a higher frequency than the recovery clock Rclk. The phase difference zero detection circuit 212 includes a counter 2121, a phase difference processing unit 2122, an OR-circuit 2123, and a phase difference direction detection unit 2124.

First, the counter 2121 will be described. The recovery clock Rclk is substantially identical to the processing clock of the master 11 that transmits communication data to be input to the CDR 211. The frequency of the recovery clock Rclk is set to be the same as the frequency of the processing clock Sclk of the slave 21. However, actually, due to an individual difference between crystal oscillators, the frequency of the recovery clock Rclk is subtly different from the frequency of the processing clock Sclk of the slave 21, and over time, the phase of the recovery clock Rclk shifts from the phase of the processing clock Sclk. In general, when the counter 2121 counts the number of rising edges of the recovery clock Rclk using the processing clock Sclk, the number of rising edges of the recovery clock Rclk in one cycle of the processing clock is one. However, at the timing at which the phase difference is zero, when the counter 2121 counts the number of rising edges of the recovery clock Rclk using the processing clock Sclk, the number of rising edges of the recovery clock Rclk in one cycle of the processing clock is zero or two.

As illustrated in the timing chart of FIG. 5, when the processing clock Sclk has a lower frequency than the recovery clock Rclk and the number of rising edges of the recovery clock Rclk is counted using the processing clock Sclk, the number of rising edges of the recovery clock Rclk in one cycle of the processing clock is two. On the other hand, as illustrated in the timing chart of FIG. 6, when the processing clock Sclk has a higher frequency than the recovery clock Rclk and the counter 2121 counts the number of rising edges of the recovery clock Rclk using the processing clock Sclk, the number of rising edges of the recovery clock Rclk in one cycle of the processing clock is zero.

In this way, since the output of the counter 2121 is zero or two at the timing of the phase difference zero and the output of the counter 2121 is one at other timings, it is possible to detect the timing of the phase difference zero. The output of the counter 2121 is output to the phase difference processing unit 2122.

The phase difference processing unit 2122 outputs the signal of the signal level "1" to one input terminal of the OR-circuit 2123 and the terminal a of the phase difference direction detection unit 2124 when the count value input from the counter 2121 is zero. The phase difference processing unit 2122 outputs a signal of the signal level "1" to the other input terminal of the OR-circuit 2123 and the terminal b of the phase difference direction detection unit 2124 when the count value is two. In this example, although the counter 2121 of the phase difference zero detection circuit 212 counts the number of rising edges of the recovery clock Rclk using the processing clock Sclk, the number of falling edges of the recovery clock Rclk may be counted using the processing clock Sclk.

The OR-circuit 2123 outputs a signal level "1" when the count value is zero or two. The phase difference direction detection unit 2124 outputs a signal of the signal level "0" when a signal of the signal level "1" is input to the terminal a, outputs a signal of the signal level "1" when a signal of the signal level "1" is input to the terminal b, and latches when a signal of the signal level "1" is not input to the terminal a or b. The output of the phase difference direction detection unit 2124 indicates the direction in which the phase of the processing clock Sclk shifts. When the phase difference direction detection unit 2124 outputs a signal of the signal level "0" (when the count value is zero), the processing clock Sclk has a higher frequency than the recovery clock Rclk. On the other hand, when the phase difference direction detection unit 2124 outputs a signal of the signal level "1" (when the count value is two), the processing clock Sclk has a lower frequency than the recovery clock Rclk.

Figure 7:
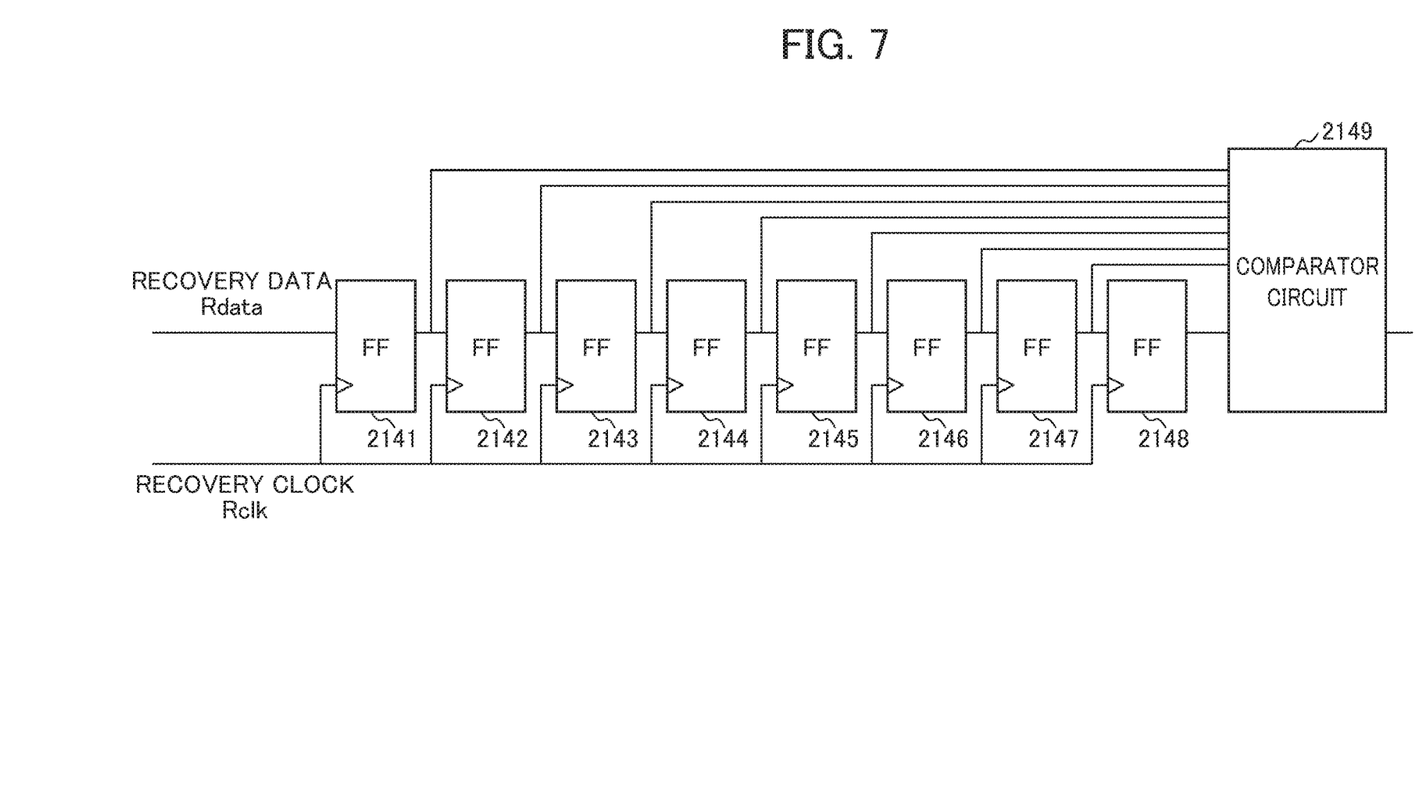
FIG. 7 is a block diagram illustrating a configuration of a synchronization code detection circuit.

Next, the synchronization code detection circuit will be described with reference to FIG. 7. FIG. 7 is a block diagram illustrating a configuration of the synchronization code detection circuit. Code data which is not output in general communication data is used as the synchronization code. If the synchronization code is an 8-bit synchronization code, for example, the synchronization code detection circuit 214 includes eight flip-flops 2141 to 2148 and beats the recovery data Rdata eight times. When the data registered in advance in a comparator circuit 2149 is identical to the output from each of the flip-flops 2141 to 2148, the synchronization code detection circuit 214 outputs a signal of the signal level "1" to the output Sync assuming that the synchronization code is output.

Finally, the phase difference calculation unit 217 will be described with reference to FIG. 3. As described above, the output D3 of the latch circuit 215, the output D2 of the latch circuit 216, and the phase difference direction output of the phase difference direction detection unit 2124 are input to the phase difference calculation unit 217. Here, the output D3 of the latch circuit 215 indicates the number of rising edges of the processing clock Sclk in a period until the synchronization code is detected after the phase difference between the processing clock Sclk and the recovery clock Rclk is zero. Similarly, the output D2 of the latch circuit 216 indicates the number of rising edges of the processing clock Sclk in a period until the phase difference between the next processing clock Sclk and the next recovery clock Rclk is zero after the phase difference between the processing clock Sclk and the recovery clock Rclk is zero. Moreover, the phase difference direction signal of the output of the phase difference direction detection unit 2124 is information indicating which one of the frequency of the processing clock Sclk and the frequency of the recovery clock Rclk is higher.

The number of rising edges of the output D2 of the latch circuit 216 corresponds to the number of clock generation times (a first number of clock generation times) of the processing clock Sclk in a period from a timing (a first timing) at which the phase difference between the processing clock Sclk and the recovery clock Rclk is zero, detected by the phase difference zero detection circuit 212, to a timing (a second timing) at which the phase difference between the next processing clock Sclk and the next recovery clock Rclk is zero. The number of rising edges of the output D3 of the latch circuit 215 corresponds to the number of clock generation times (a second number of clock generation times) of the processing clock Sclk in a period from a timing (a first timing) at which the phase difference between the processing clock Sclk and the recovery clock Rclk is zero, detected by the phase difference zero detection circuit 212, to a timing (a third timing) at which the synchronization code is detected by the synchronization code detection circuit 214. In the present embodiment, the first, and second numbers of clock generation times may be obtained using the counter 213 and the latch circuits 215 and 216, the number of clock generation times may be obtained by other circuit configurations.

The phase difference calculation unit 217 calculates the phase difference between the synchronization code and the processing clock in the following manner on the basis of the output D3 of the latch circuit 215, the output D2 of the latch circuit. 216, and the phase difference direction output of the phase difference zero detection circuit 212. A phase delay β of the synchronization code in relation to the processing clock Sclk is calculated by Equation 1 (indicated by Math 1) when the frequency of the processing clock Sclk is higher than the frequency of the recovery clock Rclk and is calculated by Equation 2 (indicated by Math 2) when the frequency of the processing clock Sclk is lower than the frequency of the recovery clock Rclk.

[Math. 1]

(OUTPUT VALUE OF LATCH CIRCUIT 215)/
(OUTPUT VALUE OF LATCH CIRCUIT 216)(EQUATION 1)

[Math. 2]

1−(OUTPUT VALUE OF LATCH CIRCUIT 215)/
(OUTPUT VALUE OF LATCH CIRCUIT 216)(EQUATION 2)

Figure 8:
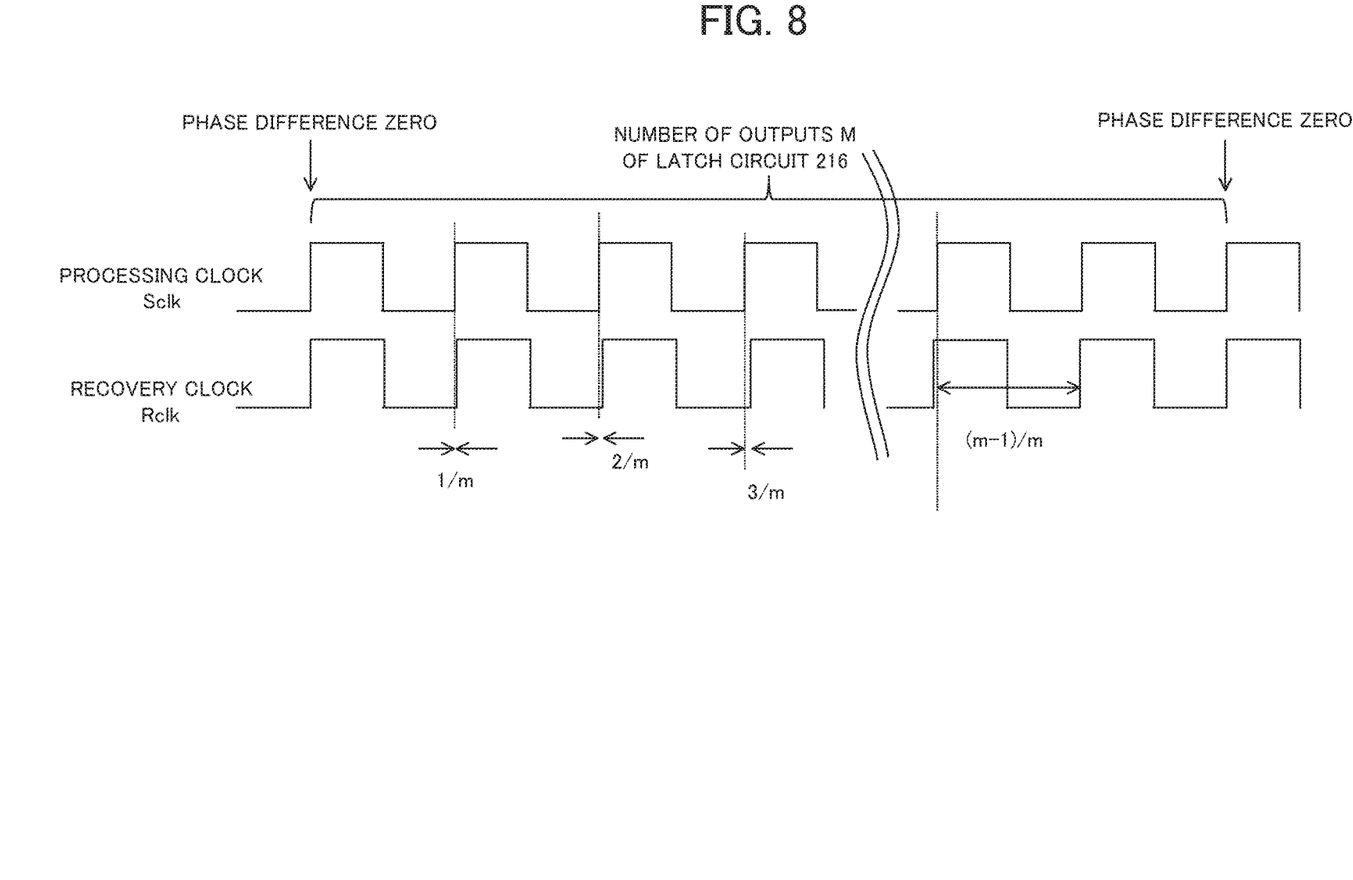
FIG. 8 is a timing chart for describing a calculation formula when a processing clock in a phase difference calculation unit has a higher frequency than a recovery clock.
Figure 9:
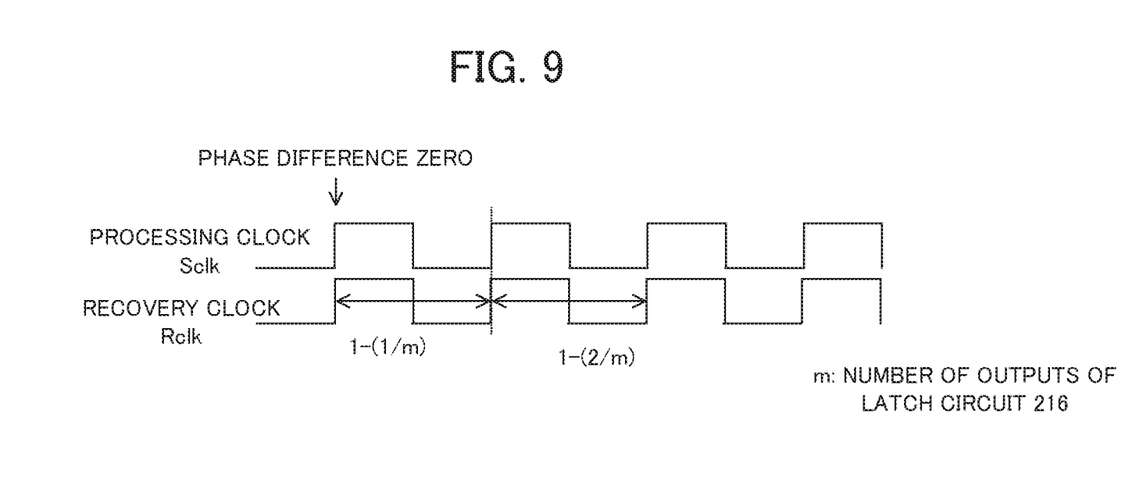
FIG. 9 is a timing chart for describing a calculation formula when a processing clock in a phase difference calculation unit has a lower frequency than a recovery clock.

Equations 1 and 2 will be described with reference to FIGS. 8 and 9. FIG. 8 is a timing chart, when the frequency of the processing clock is higher than the frequency of the recovery clock. FIG. 9 is a timing chart when the frequency of the recovery clock is lower than the frequency of the processing clock.

When the frequency of the processing clock Sclk is higher than the frequency of the recovery clock Rclk, as illustrated in the timing chart of FIG. 8, since the recovery clock Rclk is later than the processing clock Sclk by one processing clock in the number of outputs of the processing clock Sclk of the latch circuit 216, the recovery clock Rclk is later than the processing clock Sclk by 1/(number of outputs m of the latch circuit 216) every 1 clk of the processing clock Sclk. Since the output of the latch circuit 215 indicates the number of rising edges of the processing clock Sclk in a period until the synchronization code is detected after the phase difference between the processing clock Sclk and the recovery clock Rclk is zero, the phase delay β of the synchronization code in relation to the processing clock Sclk can be calculated by Equation 1.

In contrast, when the frequency of the processing clock Sclk is lower than the frequency of the recovery clock Rclk, as illustrated in the timing chart of FIG. 9, since the recovery clock is earlier than the processing clock by 1/m every 1 clk of the processing clock Sclk, the phase delay β of the synchronization code in relation to the processing clock Sclk can be calculated by Equation 2.

As described above, in the present embodiment, it is possible to calculate the phase difference between the clock of the reception data and the processing clock of the slave using a digital circuit. As a result, it is possible to create an ASIC having high portability and high synchronization performance.

Second Embodiment

Figure 10:
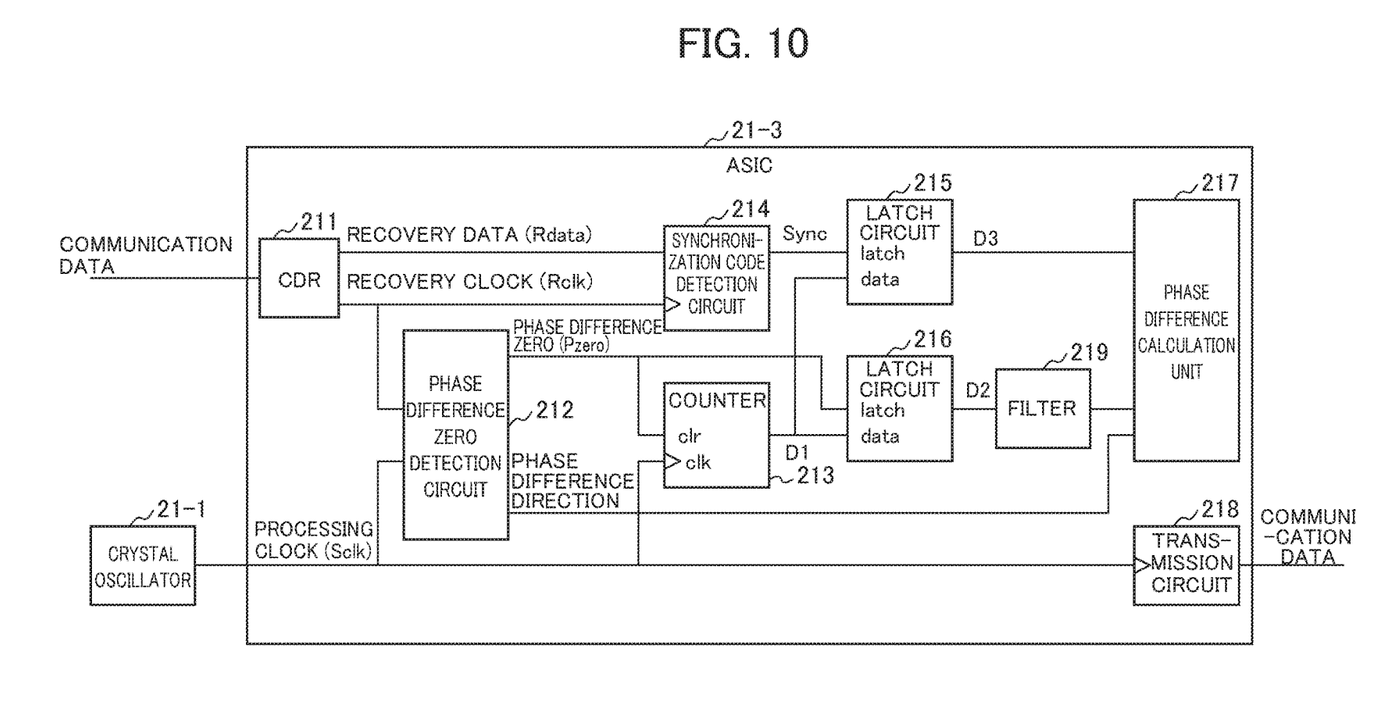
FIG. 10 is a block diagram illustrating a configuration of a phase difference estimation circuit that serves as a phase difference estimation device of a second embodiment of the present invention.

FIG. 10 is a block diagram illustrating a configuration of a phase difference estimation circuit that serves as a phase difference estimation device of a second embodiment of the present invention. FIG. 10 illustrates a configuration of a slave 21 illustrated in FIG. 1. The slave 21 includes a phase difference estimation circuit 21-3 and a crystal oscillator 21-1. The phase difference estimation circuit 21-3 is an ASIC. The communication data is transmitted from the master 11 illustrated in FIG. 1. In the phase difference estimation circuit 21-3 illustrated in FIG. 10, the same constituent members as those of the phase difference estimation circuit 21-2 illustrated in FIG. 3 will be denoted by the same reference numerals as those of the phase difference estimation circuit 21-2, and the description thereof will be omitted.

The phase difference estimation circuit 21-3 of the second embodiment illustrated in FIG. 10 and the phase difference estimation circuit 21-2 of the first embodiment illustrated in FIG. 3 are different in that a filter 219 such as an infinite impulse response (IIR) filter is inserted between the latch circuit 216 and the phase difference calculation unit 217 to obtain an average of the intervals of the phase difference zero. The latch circuit 216 calculates the number of rising edges of the processing clock Sclk in a period until the phase difference of the next processing clock Sclk and the next recovery clock Rclk is zero after the phase difference between the processing clock Sclk and the recovery clock Rclk is zero. However, the oscillation frequencies of the crystal oscillators 11-1 and 21-1 may vary and the interval of the phase difference zero may vary.

In the present embodiment, the filter 219 takes the average of the intervals of the phase difference zero, and the phase difference calculation unit 217 calculates the phase difference. Therefore, it is possible to suppress the influence of variations in the interval of the phase difference zero.

Third Embodiment

Figure 11:
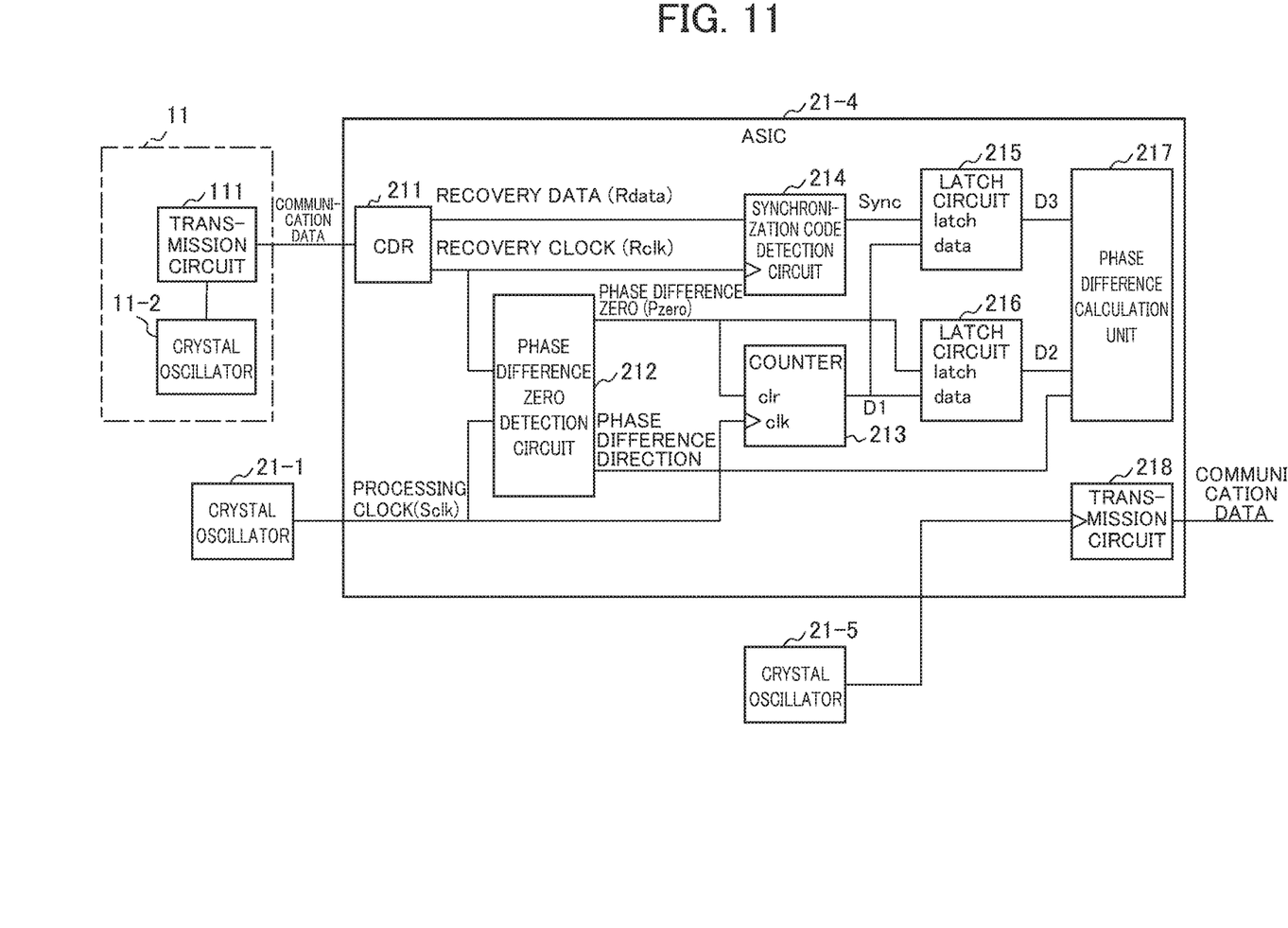
FIG. 11 is a block diagram illustrating a configuration of a phase difference estimation circuit that serves as a third embodiment of the present invention.

FIG. 11 is a block diagram illustrating a configuration of a phase difference estimation circuit that serves as a phase difference estimation device of a third embodiment of the present invention. FIG. 11 illustrates a configuration of the master 11 and the slave 21 illustrated in FIG. 1. The slave 21 includes a phase difference estimation circuit 21-4, a crystal oscillator 21-1, and a crystal oscillator 21-5. The phase difference estimation circuit 21-4 is an ASIC. The communication data is transmitted from the master 11. In the phase difference estimation circuit 21-4 illustrated in FIG. 11, the same constituent members as those of the phase difference estimation circuit 21-2 illustrated in FIG. 3 will be denoted by the same reference numerals as those of the phase difference estimation circuit 21-2, and the description thereof will be omitted.

In the phase difference estimation circuit of the first embodiment, when a frequency deviation between the crystal oscillator 11-1 of the master 11 and the crystal oscillator 21-1 of the slave 21 is very small, the counter 213 overflows and the phase difference is unknown. When the slave 21 uses the crystal oscillator 21-1 having the frequency of 100 MHz+100 ppm, for example, the actual frequency is between 99.99 MHz and 100.01 MHz. When the crystal oscillator 11-2 having the frequency of 99.96 MHz±100 ppm is prepared as a crystal oscillator for driving the transmission circuit 111 of the master 11, this frequency is approximately between 99.95 MHz and 99.97 MHz and does not overlap the frequency of the crystal oscillator 21-1.

In the master 11, the crystal oscillator 11-2 is prepared separately from the crystal oscillator 11-1 and is used in the transmission circuit 111. Even when the same frequency as the crystal oscillator 11-1 of the master 11 is used as the frequency of the crystal oscillator 21-1 that generates the processing clock of the slave 21, it is possible to reliably prevent overflow of the counter of the slave 21 that serves as a destination and to calculate the phase difference. Similarly, even when a crystal oscillator having the frequency of 100 MHz ±100 ppm is used as a crystal oscillator for the processing clock in the slave 22, if the crystal oscillator 21-5 having the frequency of 99.96 MHz±100 ppm is used as a crystal oscillator for driving the transmission circuit 218 in the slave 21, it is possible to reliably prevent overflow of the counter of the slave 22 that serves as a destination and to calculate the phase difference.

In the embodiments described above, the phase difference estimation circuit is configured by an application specific integrated circuit (ASIC). However, the phase difference estimation circuit may be configured by other integrated circuits (ICs) such as an application specific standard product (ASSP) or a field programmable gate array (FPGA). All or some of the functions of the phase difference estimation circuit may be realized by hardware, software, or a combination thereof. Here, the function s being realized by software mean that the functions are realized by a computer reading and executing a program.

Hereinabove, although representative embodiments of the present invention have been described, the present invention may be implemented in various other forms without departing from the spirit or the major characteristics of the invention defined by the claims of the present application. Therefore, the embodiments described above are only exemplary ones, and thus, the present invention should not be construed in a limitative sense. The scope of the present invention is defined by the claims, but it is not limited by the description of the specification or the abstract. In addition, all equivalent modifications or alterations within the claims fall within the scope of the present invention.

EXPLANATION OF REFERENCE NUMERALS

11: Master
21 to 2n: Slave
11-1, 21-1: Crystal oscillator
111, 218: Transmission circuit
211: CDR
212: Phase difference zero detection circuit
213: Counter
214: Synchronization code detection circuit
215, 216: Latch circuit
217: Phase difference calculation unit

What is claimed is:
1. A phase difference estimation device comprising:
  a recovery unit configured to separate recovery data and a recovery clock from input communication data and output the recovery data and the recovery clock;
  a phase difference zero detection unit configured to detect a timing at which a phase difference between a generated processing clock and the recovery clock is zero;
  a synchronization code detection unit, configured to detect a synchronization code included in the recovery data using the recovery clock; and
  a phase difference calculation unit, configured to calculate a phase difference between the synchronization code and the processing clock using a ratio between a first number of clock generation times of the processing clock in a period from a first timing at which the phase difference detected by the phase difference zero detection unit is zero to a second timing at which the phase difference is subsequently zero, and a second number of clock generation times of the processing clock in a period from the first timing to a third timing in which the synchronization code is detected by the synchronization code detection unit.

2. The phase difference estimation device according to claim 1, further comprising:
  a counter configured to count the number of rising or falling edges of the processing clock from the first timing;
  a first latch circuit configured to output a count value of the counter from the first timing to the third timing on the basis of a synchronization code detection signal from the synchronization code detection unit; and
  a second latch circuit configured to output a count value of the counter from the first timing to the second timing, wherein
  the second number of clock generation times corresponds to the count value output from the first latch circuit and the first number of clock generation times corresponds to the count value output from the second latch circuit.

3. The phase difference estimation device according to claim 2, wherein the phase difference calculation unit calculates the phase difference between the synchronization code and the processing clock by dividing an output value of the first latch circuit by an output value of the second latch circuit when the frequency of the processing clock is higher than the frequency of the recovery clock.

4. The phase difference estimation device according to claim 2, wherein
the phase difference calculation unit calculates the phase difference between the synchronization code and the processing clock by subtracting a value obtained by dividing an output value of the first latch circuit by an output value of the second latch circuit from 1 when the frequency of the processing clock is lower than the frequency of the recovery clock.

5. The phase difference estimation device according to claim 2, wherein
a filter configured to take an average value of intervals between timings at which the phase difference is zero is provided between the second latch circuit and the phase difference calculation unit.

6. A communication device comprising:
the phase difference estimation device according to claim 1;
a first oscillator configured to generate the processing clock; and
a second oscillator configured to generate a clock having a frequency shifted by a certain amount from the frequency of the first oscillator, wherein
the communication device processes transmission communication data using the clock of the second oscillator.

* * * * *